United States Patent
Xi (10) Patent No.: US 11,847,955 B1
(45) Date of Patent: Dec. 19, 2023

(54) SHIFT REGISTER AND METHOD FOR DRIVING THE SAME, LIGHT-EMISSION CONTROL CIRCUIT, AND DISPLAY PANEL

(71) Applicant: Wuhan Tianma Microelectronics Co., Ltd., Wuhan (CN)

(72) Inventor: Suping Xi, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 18/076,418

(22) Filed: Dec. 7, 2022

(30) Foreign Application Priority Data

Jun. 29, 2022 (CN) .......................... 202210748111.5

(51) Int. Cl.
  *G09G 3/20* (2006.01)
  *G11C 19/28* (2006.01)

(52) U.S. Cl.
  CPC ... *G09G 3/2096* (2013.01); *G09G 2310/0286* (2013.01); *G11C 19/28* (2013.01)

(58) Field of Classification Search
  CPC .. G09G 3/2092; G09G 3/3674; G09G 3/3677; G09G 2300/0408; G09G 2300/0426; G09G 2310/0286; G09G 2310/061; G09G 2310/08; G09G 2320/0209; G09G 2320/0223; G09G 2320/0257; G09G 2330/027; G09G 3/3233; G09G 3/3266; G09G 2300/0819; G09G 2300/0842; G09G 2300/0861; G09G 2310/0262; G09G 2310/0278; G11C 19/28
  See application file for complete search history.

(56) References Cited

U.S. PATENT DOCUMENTS

2021/0065601 A1* 3/2021 Zheng ..................... G11C 19/28
2022/0208070 A1* 6/2022 Dong ................... G09G 3/2092

* cited by examiner

*Primary Examiner* — Nelson M Rosario
(74) *Attorney, Agent, or Firm* — East IP P.C.

(57) ABSTRACT

The present application discloses a shift register and a method for driving the shift register, a light-emission control circuit and a display panel. The shift register includes an input module, a control module, a pull-up module, an output module and a maintenance module. The input module is connected to an input end, a first clock end, a first level end, a first node and a second node. The control module is connected to the first node, a third node, and a second clock end. The pull-up module is connected to the second node, a second level end, and the third node. The output module is connected to the second node, the third node, the first level end, and the second level end. The maintenance module is connected to the second node, the first level end and the second level end.

19 Claims, 7 Drawing Sheets

SHIFT REGISTER AND METHOD FOR DRIVING THE SAME, LIGHT-EMISSION CONTROL CIRCUIT, AND DISPLAY PANEL

CROSS-REFERENCE TO RELATED APPLICATION

This application claims priority to Chinese Patent Application No. 202210748111.5, filed on Jun. 29, 2022, which is hereby incorporated by reference in its entirety.

TECHNICAL FIELD

The present application relates to the field of display technology, and in particular, to a shift register and a method for driving the shift register, a light-emission control circuit, and a display panel.

BACKGROUND

In the field of displays, utilization of a shift register is often needed, for example, in order to realize a function of light-emission control. An output level of the shift register needs to be stable. However, in the related art, since there is a level fluctuation of a control node of an output module, the output stability is affected.

SUMMARY

Embodiments of the present application provide a shift register and a method for driving the shift register, a light-emission control circuit and a display panel, which can improve the output stability of the shift register.

In a first aspect, an embodiment of the present application provides a shift register including an input module, a control module, a pull-up module, an output module and a maintenance module, where the input module is connected to an input end, a first clock end, a first level end, a first node and a second node, and is configured to control levels of the first node and the second node in response to levels of the input end, the first clock end and the first level end; the control module is connected to the first node, a third node and a second clock end, and is configured to control a level of the third node in response to the level of the first node and a level of the second clock end; the pull-up module is connected to the second node, a second level end and the third node, and is configured to transfer a level of the second level end to the third node in response to an active level of the second node; the output module is connected to the second node, the third node, the first level end and the second level end, and is configured to transfer a first level of the first level end to the output end in response to the active level of the second node, or transfer a second level of the second level end to the output end in response to an active level of the third node; the maintenance module is connected to the second node, the first level end and the second level end, and is configured to respond to the level of the second node and maintain the level of the second node.

In a second aspect, an embodiment of the present application provides a method for driving a shift register comprising an input module, a control module, a pull-up module, an output module and a maintenance module, wherein
the input module is connected to an input end, a first clock end, a first level end, a first node and a second node, and is configured to control levels of the first node and the second node in response to levels of the input end, the first clock end and the first level end;
the control module is connected to the first node, a third node and a second clock end, and is configured to control a level of the third node in response to the level of the first node and a level of the second clock end;
the pull-up module is connected to the second node, a second level end and the third node, and is configured to transfer a level of the second level end to the third node in response to an active level of the second node;
the output module is connected to the second node, the third node, the first level end and the second level end, and is configured to transfer a first level of the first level end to the output end in response to the active level of the second node, or transfer a second level of the second level end to the output end in response to an active level of the third node;
the maintenance module is connected to the second node, the first level end and the second level end, and is configured to respond to the level of the second node and maintain the level of the second node, and
where the method includes:
in a first phase, providing a high level by the input end, providing a low level by the first clock end, and providing a high level by the second clock end, so that the high level of the input end is transferred to the second node, a low level of the first level end is transferred to the first node, the third node is maintained at a low level, and a low level is outputted by the output end;
in a second phase, providing the high level by the input end, providing a high level by the first clock end, and providing a low level by the second clock end, so that the second node is maintained at a high level, the first node is maintained at a low level, the low level of the second clock end is transferred to the third node, and a high level is outputted by the output end;
in a third phase, providing the high level by the input end, providing the low level by the first clock end, and providing the high level by the second clock end, so that the high level of the input end is transferred to the second node, the low level of the first clock end and the low level of the first level end are transferred to the first node, the third node is maintained at the low level, and the high level is outputted by the output end;
in a fourth phase, providing a low level by the input end, providing the high level by the first clock end, and providing the low level by the second clock end, so that the second node is maintained at the high level, the first node is maintained at the low level, the low level of the second clock end is transferred to the third node, and the high level is outputted by the output end;
in a fifth phase, providing the low level by the input end, providing the low level by the first clock end, and providing the high level by the second clock end, so that the low level of the input end is transferred to the second node, the low level of the first clock end and the low level of the first level end are transferred to the first node, the high level of the second level end is transferred to the third node, and the low level is outputted by the output end;
in a sixth phase, providing the low level by the input end, providing the high level by the first clock end, and providing the low level by the second clock end, so that the second node is maintained at the low level, the high level of the first clock end is transferred to the first node, the high level of the second level end is transferred to the third node, and the low level is outputted by the output end.

In a third aspect, an embodiment of the present application provides a light-emission control circuit including the shift register according to embodiments of the first aspect.

In a fourth aspect, an embodiment of the present application provides a display panel including the light-emission control circuit according to embodiments of the third aspect.

BRIEF DESCRIPTION OF THE DRAWINGS

Other features, objects and advantages of the present application will be apparent from the detailed description of non-limiting embodiments which follows, taken in conjunction with the accompanying drawings, in which like references indicate same or similar features and the figures have not necessarily been drawn to scale.

DETAILED DESCRIPTION

Features and exemplary embodiments of various aspects of the present application will be described in detail below. In order to make objects, technical solutions and advantages of the present application clearer, the present application is further described in detail below with reference to the drawings and specific embodiments. It should be understood that, specific embodiments described herein are merely for the illustration of the present application, not for limiting the present application. For those skilled in the art, the present application may be implemented without some of these specific details. The following description of the embodiments is only for providing a better understanding of the present application by illustrating examples of the present application.

It should be noted that, herein, relational terms such as "first" and "second" are used only for distinguishing one entity or operation from another entity or operation, and do not necessarily require or imply any such actual relationship or order between these entities or operations. Moreover, the terms "comprising", "including", or any other variation thereof, are intended to encompass a non-exclusive inclusion, such that a process, a method, an article or a device including a series of elements not only includes these elements, but also includes other elements not explicitly listed, or includes elements inherent to the process, the method, the article or the device. Without further limitation, an element preceded by "including . . . " does not exclude presence of additional similar elements in a process, a method, an article or a device including the element.

It should be understood that, in describing a structure of an assembly, when a layer or a region is referred as being "on" or "over" another layer or another region, the layer or the region may be directly on the another layer or the another region, or other layer or other region may exist between the layer or the region and the another layer or the another region. Further, if the assembly is turned over, the layer or the region will be "below" or "beneath" the another layer or the another area.

It should be understood that, the term "and/or" used herein refers to only an association relationship for describing associated objects, which includes three possible kinds of relationships. For example, "A and/or B" may represent three possible cases including "A existing alone", "A and B existing simultaneously", and "B existing alone". In addition, the character "/" herein generally represents that there is an "or" relationship between the associated objects preceding and succeeding the character "/" respectively.

In the embodiments of the present application, the term "connection" may refer to a direct connection between two components, or may refer to a connection between the two components via one or more other components.

In the embodiments of the present application, connection nodes, such as a first node, a second node and a third node, are only defined to facilitate the description of the circuit structure, and the connection nodes, such as the first node, the second node and the third node, are not actual circuit units.

It will be apparent to those skilled in the art that various modifications and variations can be made in the present application without departing from the gist or the scope of the present application. Accordingly, the present application is intended to cover modifications and variations of the present application that fall within the scope of the appended claims (the claimed technical solutions) and their equivalents. It should be noted that, implementations provided by the embodiments of the present application can be combined with one another if there is no conflict.

Before explaining the technical solutions provided by the embodiments of the present application, in order to facilitate the understanding of the embodiments of the present application, the present application first specifically describes the problems existing in the related art.

In the related art, there is a level fluctuation of a control node of an output module. It is found by the Inventor after study that, the control node of the output module is affected by levels of other nodes in a floating state, which causes the level fluctuation of the control node of the output module, thereby affecting the output stability. In addition, because a clock signal frequently switches between a high level and a low level, the level of the control node of the output module fluctuates, thereby affecting the output stability.

In order to solve the above problems, the embodiments of the present application provide a shift register and a method for driving the shift register, a light-emission control circuit, and a display panel. Embodiments of the shift register and the method for driving the shift register, the light-emission control circuit, and the display panel will be described below with reference to the drawings.

First, a shift register according to an embodiment of the present application is described.

Figure 1:
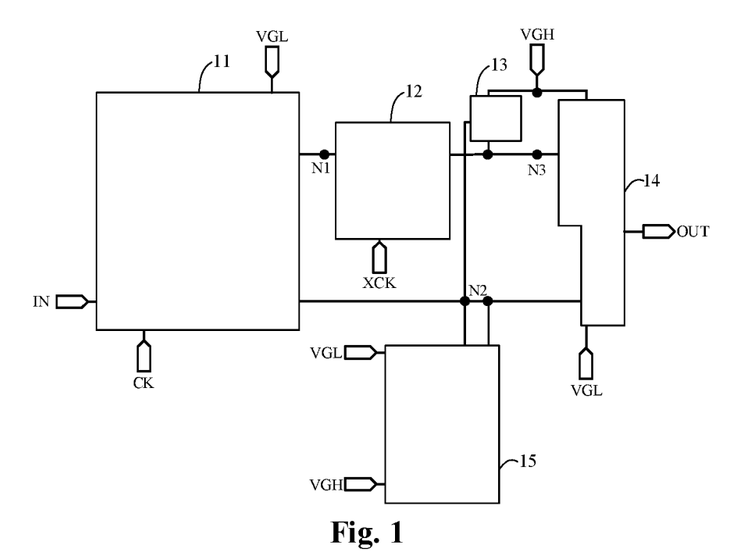
FIG. 1 illustrates a schematic structural diagram of a shift register according to an embodiment of the present application.

As shown in FIG. 1, the shift register may include an input module 11, a control module 12, a pull-up module 13, an output module 14 and a maintenance module 15.

The input module 11 is connected to an input end IN, a first clock end CK, a first level end VGL, a first node N1 and a second node N2. The input module 11 is configured to control a level of the first node N1 and a level of the second node N2 in response to a level of the input end IN, a level of the first clock end CK and a level of the first level end VGL.

The control module 12 is connected to the first node N1, a third node N3, and a second clock end XCK. The control module 12 is configured to control a level of the third node N3 in response to the level of the first node N1 and a level of the second clock end XCK.

The pull-up module 13 is connected to the second node N2, a second level end VGH, and the third node N3. The pull-up module 13 is configured to transfer a level of the second level end VGH to the third node N3 in response to an active level of the second node N2.

The output module 14 is connected to the second node N2, the third node N3, the first level end VGL, and the second level end VGH. The output module 14 is configured to transfer a first level of the first level end VGL to an output end OUT in response to the active level of the second node N2, or the output module 14 is configured to transfer a second level of the second level end VGH to the output end OUT in response to the active level of the third node N3.

The maintenance module 15 is connected to the second node N2, the first level end VGL, and the second level end VGH. The maintenance module 15 is configured to respond to the level of the second node N2 and maintain the level of the second node N2.

Specifically, the shift register may be applied in a light-emission control circuit. The light-emission control circuit may be applied in a display panel. A signal outputted by the shift register may be configured to control a light-emitting time of sub-pixels in the display panel. The input module 11, the control module 12, the pull-up module 13, the output module 14 and the maintenance module 15 cooperate with each other to realize the control of the output end of the shift register, so as to realize the function of the shift register.

Herein, the first level provided by the first level end VGL may be a low level, and the second level provided by the second level end VGH may be a high level. The input end IN may provide a start signal. The first clock end CK and the second clock end XCK provide clock signals with alternating high and low levels.

Herein, a "level" may also be referred to as a "potential". The shift register may include a transistor. As used herein, an "active level" may refer to a level at which the transistor can be controlled to be turned on. For example, if the transistor is a P-type transistor, a turn-on level may be a low level; and if the transistor is an N-type transistor, the turn-on level may be a high level. In addition, if the transistor is a P-type transistor, a turn-off level may be a high level; and if the transistor is an N-type transistor, the turn-off level may be a low level.

Figure 2:
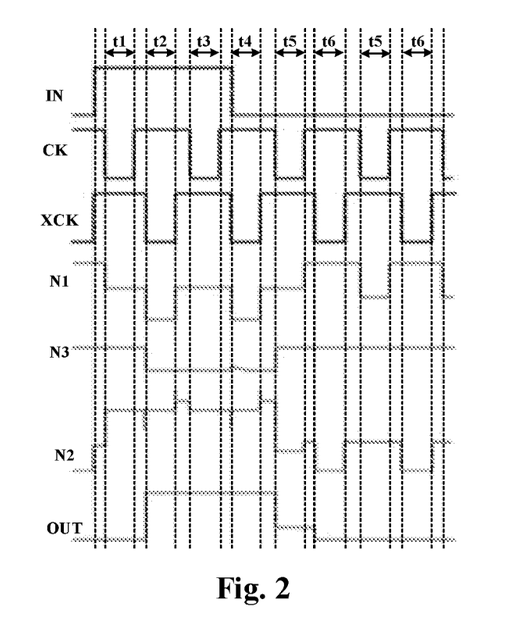
FIG. 2 illustrates a schematic timing sequence diagram of a shift register according to an embodiment of the present application.
Figure 3:
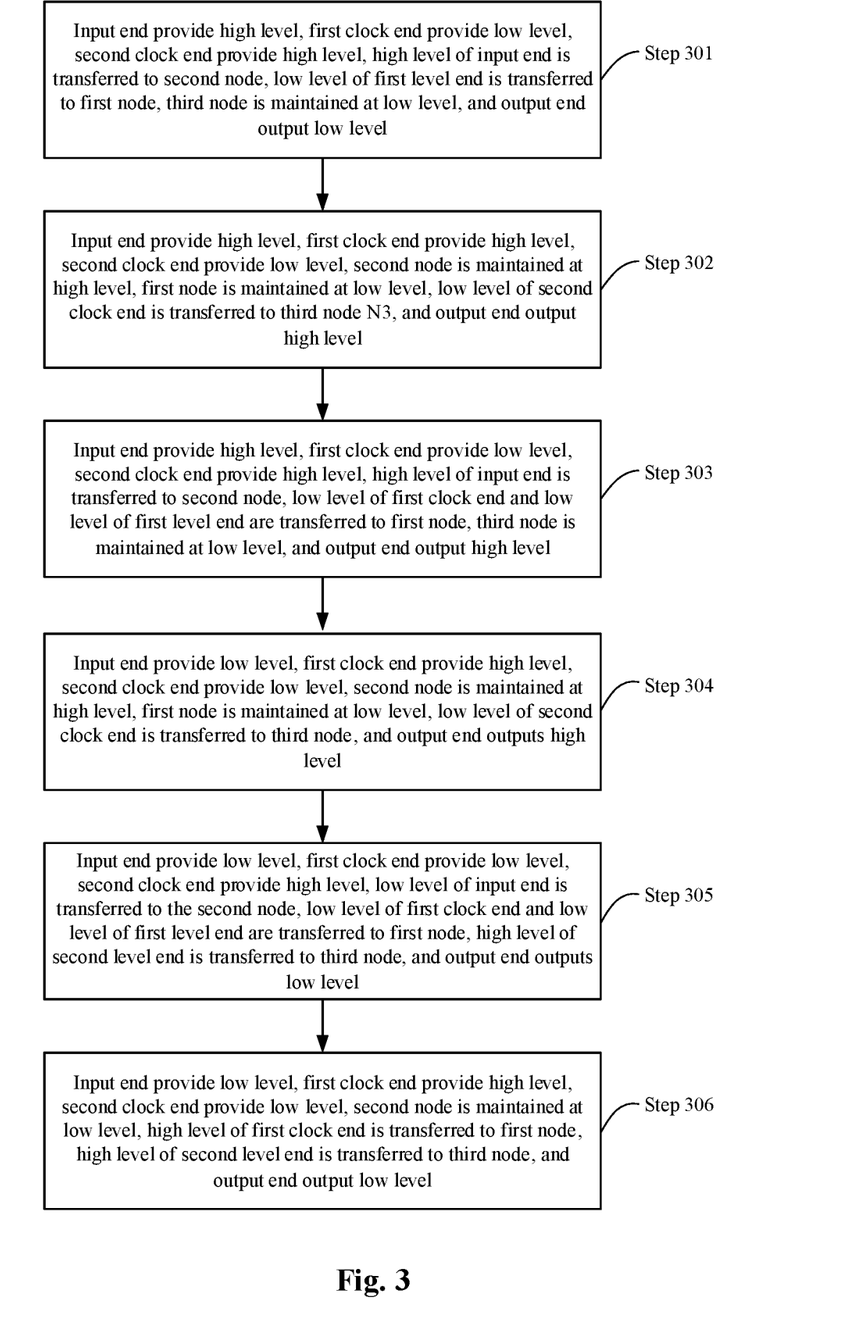
FIG. 3 illustrates a schematic flowchart of a method for driving a shift register according to an embodiment of the present application.

FIG. 2 illustrates a schematic timing sequence diagram of a shift register according to an embodiment of the present application. FIG. 3 illustrates a schematic flowchart of a method for driving a shift register according to an embodiment of the present application, which can be applied to the shift register of the above embodiment.

The method for driving the shift register according to an embodiment of the present application will be described below with reference to the structure of the shift register in FIG. 1 and the timing sequence in FIG. 2. As shown in FIG. 3, the method for driving the shift register according to an embodiment of the present application includes step 301 to step 306.

At step 301, as shown in a first phase t1, the input end IN provides a high level, the first clock end CK provides a low level, the second clock end XCK provides a high level, the high level of the input end IN is transferred to the second node N2, a low level of the first level end VGL is transferred to the first node N1, the third node N3 is maintained at a low level, and the output end OUT outputs a low level.

At step 302, as shown in a second phase t2, the input end IN provides a high level, the first clock end CK provides a high level, the second clock end XCK provides a low level, the second node N2 is maintained at a high level, the first node N1 is maintained at a low level, the low level of the second clock end XCK is transferred to the third node N3, and the output end OUT outputs a high level.

At step 303, as shown in a third phase t3, the input end IN provides a high level, the first clock end CK provides a low level, the second clock end XCK provides a high level, the high level of the input end IN is transferred to the second node N2, the low level of the first clock end CK and a low level of the first level end VGL are transferred to the first node N1, the third node N3 is maintained at a low level, and the output end OUT outputs a high level.

At step 304, as shown in a fourth phase t4, the input end IN provides a low level, the first clock end CK provides a high level, the second clock end XCK provides a low level, the second node N2 is maintained at a high level, the first node N1 is maintained at a low level, the low level of the second clock end XCK is transferred to the third node N3, and the output end OUT outputs a high level.

At step 305, as shown in a fifth phase t5, the input end IN provides a low level, the first clock end CK provides a low level, the second clock end XCK provides a high level, the low level of the input end IN is transferred to the second node N2, the low level of the first clock end CK and a low level of the first level end VGL are transferred to the first node N1, a high level of the second level end VGH is transferred to the third node N3, and the output end OUT outputs a low level.

At step 306, as shown in a sixth phase t6, the input end IN provides a low level, the first clock end CK provides a high level, the second clock end XCK provides a low level, the second node N2 is maintained at a low level, the high level of the first clock end CK is transferred to the first node N1, a high level of the second level end VGH is transferred to the third node N3, and the output end OUT outputs a low level.

In the shift register and the method for driving the shift register according to embodiments of the present application, since the maintenance module 15 can respond to the level of the second node N2 and maintain the level of the second node N2, the second node N2 can be prevented from being affected by levels of other nodes in a floating state. In addition, the maintenance module 15 is not connected with the clock signal end, which can also prevent the second node N2 from being affected by the clock signal being frequently switching between a high level and a low level, thus improving the level stability of the second node N2, thereby improving the output stability.

In some optional implementations, the maintenance module 15 may be specifically configured to: transfer the second level of the second level end VGH to the second node N2 in response to the high level of the second node N2; and stop signal outputting in response to the low level of the second node N2, to maintain the low level of the second node N2. In an embodiment of the present application, the second level of the second level end VGH may be a high level, and when the second node N2 is at the high level, the level transferred by the maintenance module 15 to the second node N2 is still the high level, such that the second node N2 can be stably maintained at the high level; when the second node N2 is at the low level, the maintenance module 15 no longer transfers signals to the second node N2, such that the second node N2 can be stably maintained at the low level.

Figure 4:
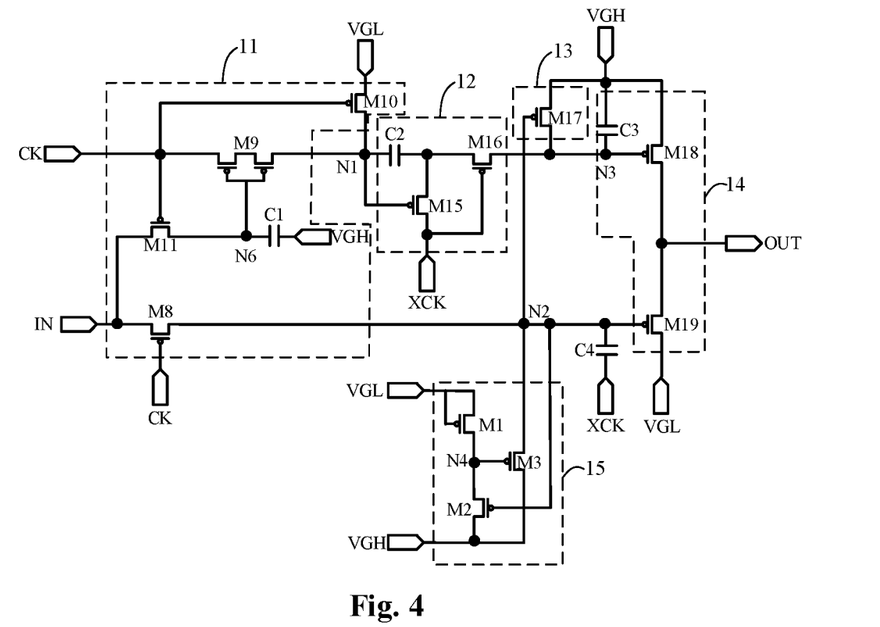
FIG. 4 illustrates a schematic structural diagram of another shift register according to an embodiment of the present application.

In some optional implementations, as shown in FIG. 4, the maintenance module 15 may include a first transistor M1, a second transistor M2 and a third transistor M3. The first transistor M1, the second transistor M2 and the third transistor M3 may all be P-type transistors.

A first terminal of the first transistor M1 is connected to a fourth node N4, and a second terminal of the first transistor M1 and a gate of the first transistor M1 are both connected to the first level end VGL.

A first terminal of the second transistor M2 is connected to the second level end VGH, a second terminal of the second transistor M2 is connected to the fourth node N4, and a gate of the second transistor M2 is connected to the second node N2.

A first terminal of the third transistor M3 is connected to the second level end VGH, a second terminal of the third transistor M3 is connected to the second node N2, and a gate of the third transistor M3 is connected to the fourth node N4.

In an example, the first terminal of the first transistor M1, the first terminal of the second transistor M2, and the first terminal of the third transistor M3 may be sources, and the second terminal of the first transistor M1, the second terminal of the second transistor M2, and the second terminal of the third transistor M3 may be drains.

When the second node N2 is at the high level, the first transistor M1 is turned on, the second transistor M2 is turned off, the fourth node N4 is at the low level, the third transistor M3 is turned on, the second level (high level) of the second level end VGH is transferred to the second node N2, and the second node N2 is maintained at the high level.

When the second node N2 is at the low level, both the first transistor M1 and the second transistor M2 are turned on. The inventor has found that, when the transistor is turned off, the transistor can be equivalent to a resistor with an infinite resistance value, and when the transistor is turned on, the transistor can be equivalent to a resistor with a small resistance value. The sizes of the first transistor M1 and the second transistor M2 can be set, such that when both the first transistor M1 and the second transistor M2 are turned on, with the voltage division by the first transistor M1 and the second transistor M2, the fourth node N4 is at the high level, so that the third transistor M3 is turned off (that is, the third transistor M3 is locked), the low level of the second node N2 is latched, and the second node N2 is maintained at the low level.

The inventor has also found that, a resistance value of a transistor when the transistor is turned on is inversely related to a width to length ratio of a channel of the transistor. For example, the resistance value of the transistor when the transistor is turned on is inversely proportional to the width to length ratio of the channel of the transistor. The greater the width to length ratio of the channel of the transistor is, the less the resistance value of the transistor when the transistor is turned on is. Conversely, the less the width to length ratio of the channel of the transistor is, the greater the resistance value of the transistor when the transistor is turned on is. The width to length ratio of the channel of the transistor is the ratio of the channel width to the channel length of the transistor.

In an example, a ratio of the width to length ratio of the channel of the second transistor M2 to the width to length ratio of the channel of the first transistor M1 is a first ratio K1. An absolute value of a ratio of a voltage of a signal end connected to the first terminal of the first transistor M1 to a voltage of a signal end connected to the first terminal of the second transistor M2 is a second ratio K2. The first ratio K1 may be set as being greater than the second ratio K2.

As shown in FIG. 4, the signal end connected to the first terminal of the first transistor M1 is the first level end VGL, and the signal end connected to the first terminal of the second transistor M2 is the second level end VGH. For example, the level of the first level end VGL is −7V, the level of the second level end VGH is 8V, and the second ratio K2 is equal to ⅞.

For example, the first ratio K1 may be equal to 1, the resistance values of the first transistor M1 and the second transistor M2 are equal when both the first transistor M1 and the second transistor M2 are turned on, the level of the first level end VGL is −7V, the level of the second level end VGH is 8V, the division voltages of the first transistor M1 and the second transistor M2 are the same, and the voltage of the fourth node N4 is 0.5V, so that the third transistor M3 can be turned off.

In some other optional implementations, the maintenance module 15 may be specifically configured to: transfer the first voltage of the first level end VGL to the second node N2 in response to the low level of the second node N2; and stop signal outputting in response to the high level of the second node N2, to maintain the high level of the second node N2. In an embodiment of the present application, the first level of the first level end VGL may be the low level. When the second node N2 is at the low level, the level transferred by the maintenance module 15 to the second node N2 is still the low level, such that the second node N2 can be stably maintained at the low level. When the second node N2 is at the high level, the maintenance module 15 no longer transfers signals to the second node N2, such that the second node N2 can be stably maintained at the high level.

Figure 5:
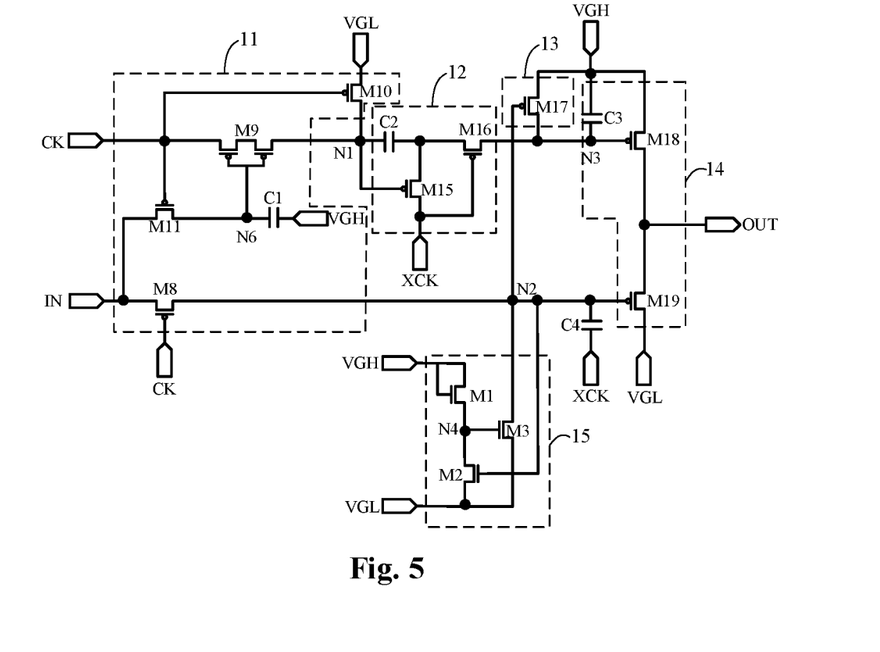
FIG. 5 to FIG. 9 illustrate schematic structural diagrams of still other shift registers according to embodiments of the present application.

In some optional implementations, as shown in FIG. 5, the first transistor M1, the second transistor M2 and the third transistor M3 included in the maintenance module 15 may all be N-type transistors.

Specifically, the first terminal of the first transistor M1 is connected to the fourth node N4, and the second terminal of the first transistor M1 and the gate of the first transistor M1 are both connected to the second level end VGH.

The first terminal of the second transistor M2 is connected to the first level end VGL, the second terminal of the second transistor M2 is connected to the fourth node N4, and the gate of the second transistor M2 is connected to the second node N2.

The first terminal of the third transistor M3 is connected to the first level end VGL, the second terminal of the third transistor M3 is connected to the second node N2, and the gate of the third transistor M3 is connected to the fourth node N4.

When the second node N2 is at the low level, the first transistor M1 is turned on, the second transistor M2 is turned off, the fourth node N4 is at the high level, the third transistor M3 is turned on, the first level (low level) of the first level end VGL is transferred to the second node N2, and the second node N2 is maintained at the low level.

When the second node N2 is at the high level, both the first transistor M1 and the second transistor M2 are turned on. Similarly, when the transistor is turned off, the transistor can be equivalent to a resistor with an infinite resistance value, and when the transistor is turned on, the transistor can be equivalent to a resistor with a small resistance value. The sizes of the first transistor M1 and the second transistor M2 can be set, such that when both the first transistor M1 and the second transistor M2 are turned on, with voltage division by the first transistor M1 and the second transistor M2, the fourth node N4 is at the low level, so that the third transistor M3 is turned off (that is, the third transistor M3 is locked), the high level of the second node N2 is latched, and the second node N2 is maintained at the high level.

In an example, a ratio of the width to length ratio of the channel of the second transistor M2 to the width to length ratio of the channel of the first transistor M1 is a first ratio K1. An absolute value of a ratio of a voltage of a signal end connected to the first terminal of the first transistor M1 to a voltage of a signal end connected to the first terminal of the second transistor M2 is a second ratio K2. The first ratio K1 may be set as being greater than the second ratio K2.

As shown in FIG. 4, the signal end connected to the first terminal of the first transistor M1 is the first level end VGL, and the signal end connected to the first terminal of the second transistor M2 is the first level end VGL. For example, the level of the first level end VGL is −7V, the level of the second level end VGH is 8V, and the second ratio K2 is equal to 8/7.

For example, the first ratio K1 may be equal to 2. When both the first transistor M1 and the second transistor M2 are turned on, the resistance value of the first transistor M1 is twice the resistance value of the second transistor M2. The level of the first level end VGL is −7V, the level of the second level end VGH is 8V, the division voltage value of the first transistor M1 is 10V, the division voltage value of the second transistor M2 is 5V, and the voltage of the fourth node N4 is −2V, such that the third transistor M3 can be turned off.

In some other optional implementations, the maintenance module 15 may be specifically configured to: transfer the second level of the second level end VGH to the second node N2 in response to the high level of the second node N2; transfer the first level of the first level end VGL to the second node N2 in response to the low level of the second node N2. In an embodiment of the present application, the second level of the second level end VGH may be the high level. When the second node N2 is at the high level, the level transferred by the maintenance module 15 to the second node N2 is still the high level, such that the second node N2 can be stably maintained at the high level. The first level of the first level end VGL can be the low level. When the second node N2 is at the low level, the signals transferred by the maintenance module 15 to the second node N2 are still at the low level, such that the second node N2 can be stably maintained at the low level.

Figure 6:
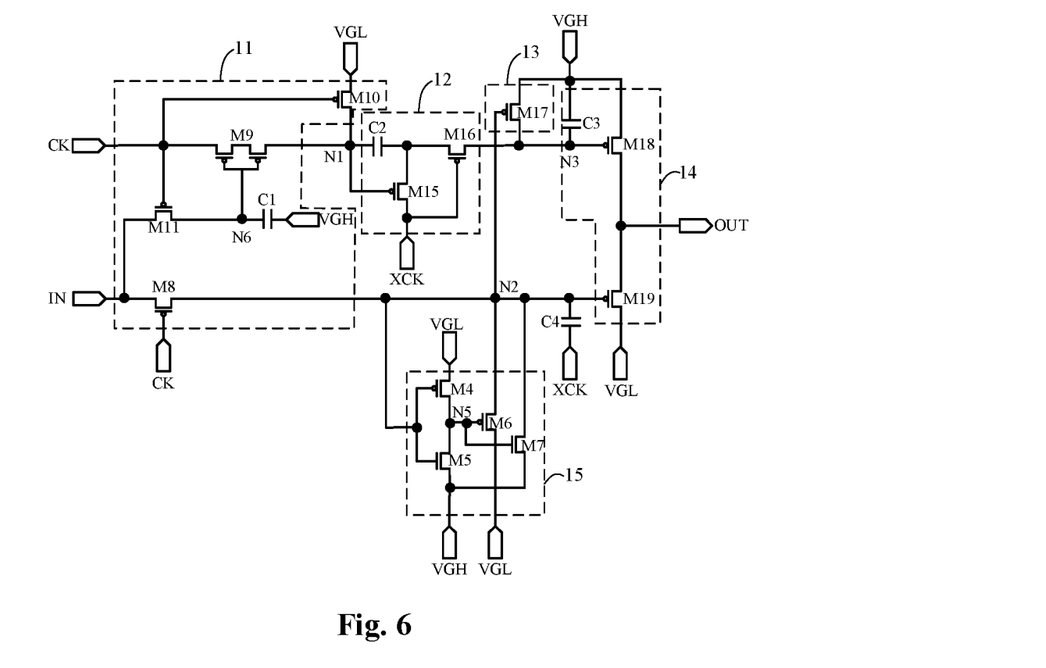

In some optional implementations, as shown in FIG. 6, the maintenance module 15 may include a fourth transistor M4, a fifth transistor M5, a sixth transistor M6 and a seventh transistor M7. The fourth transistor M4 and the sixth transistor M6 may both be P-type transistors. The fifth transistor M5 and the seventh transistor M7 may both be N-type transistors.

A gate of the fourth transistor M4 is connected to the second node N2, a first terminal of the fourth transistor M4 is connected to the fifth node N5, and a second terminal of the fourth transistor M4 is connected to the first level end VGL.

A gate of the fifth transistor M5 is connected to the second node N2, a first terminal of the fifth transistor M5 is connected to the fifth node N5, and a second terminal of the fifth transistor M5 is connected to the second level end VGH.

A gate of the sixth transistor M6 is connected to the fifth node N5, a first terminal of the sixth transistor M6 is connected to the second node N2, and a second terminal of the sixth transistor M6 is connected to the first level end VGL.

A gate of the seventh transistor M7 is connected to the fifth node N5, a first terminal of the seventh transistor M7 is connected to the second node N2, and a second terminal of the seventh transistor M7 is connected to the second level end VGH.

In an example, the first terminal of the fourth transistor M4, the first terminal of the fifth transistor M5, the first terminal of the sixth transistor M6, and the first terminal of the seventh transistor M7 may be sources. The second terminal of the fourth transistor M4, the second terminal of the fifth transistor M5, the second terminal of the sixth transistor M6, and the second terminal of the seventh transistor M7 may be drains.

When the second node N2 is at the high level, the fourth transistor M4 is turned off, the fifth transistor M5 is turned on, the second level (high level) of the second level end VGH is transferred to the fifth node N5 through the fifth transistor M5, the fifth node N5 is at the high level, the sixth transistor M6 is turned off, the seventh transistor M7 is turned on, the second level (high level) of the second level end VGH is transferred to the second node N2 through the seventh transistor M7, and the second node N2 is maintained at the high level.

When the second node N2 is at the low level, the fourth transistor M4 is turned on, the fifth transistor M5 is turned off, the first level (low level) of the first level end VGL is transferred to the fifth node N5 through the fourth transistor M4, the fifth node N5 is at the low level, the sixth transistor M6 is turned on, the seventh transistor M7 is turned off, the first level (low level) of the first level end VGL is transferred to the second node N2 through the sixth transistor M6, and the second node N2 is maintained at the low level.

In some optional implementations, as shown in any one of FIG. 4, FIG. 5 and FIG. 6, the input module 11 may include an eighth transistor M8, a ninth transistor M9, a tenth transistor M10, an eleventh transistor M11, and a first capacitor C1.

A gate of the eighth transistor M8 is connected to the first clock end CK, a first terminal of the eighth transistor M8 is connected to the input end IN, and a second terminal of the eighth transistor M8 is connected to the second node N2.

A gate of the ninth transistor M9 is connected to the sixth node N6, a first terminal of the ninth transistor M9 is connected to the first clock end CK, and a second terminal of the ninth transistor M9 is connected to the first node N1.

A gate of the tenth transistor M10 is connected to the first clock end CK, a first terminal of the tenth transistor M10 is connected to the first level end VGL, and a second terminal of the tenth transistor M10 is connected to the first node N1.

A gate of the eleventh transistor M11 is connected to the first clock end CK, a first terminal of the eleventh transistor M11 is connected to the input end IN, and a second terminal of the eleventh transistor M11 is connected to the sixth node N6.

A first terminal of the first capacitor C1 is connected to the sixth node N6, and a second terminal of the first capacitor C1 is connected to the second level end VGH.

In an example, the eighth transistor M8, the ninth transistor M9, the tenth transistor M10, and the eleventh transistor M11 may all be P-type transistors.

For each of the eighth transistor M8, the ninth transistor M9, the tenth transistor M10 and the eleventh transistor M11, one of the first terminal and the second terminal may be a source, and the other may be a drain.

According to an embodiment of the present application, the level of the first node N1 can be independent of the second node N2, and the levels of the first node N1 and the second node N2 may be independently controlled, so as to facilitate the control of the first node N1 and the second node N2. In addition, the first capacitor C1 is connected to the second level end VGH which is a constant voltage end. The first capacitor C1 can stabilize the level of the sixth node N6, thus improving the stability of the ninth transistor M9, thereby improving the level stability of the first node N1.

In some optional implementations, the ninth transistor M9 may be a dual-gate transistor. The dual-gate transistor has high stability, such that the stability of the ninth transistor M9 can be further improved, and the level stability of the first node N1 can be further improved.

In an example, when the ninth transistor M9 is the dual-gate transistor, the ninth transistor M9 may include two sub-transistors connected in series.

Figure 7:
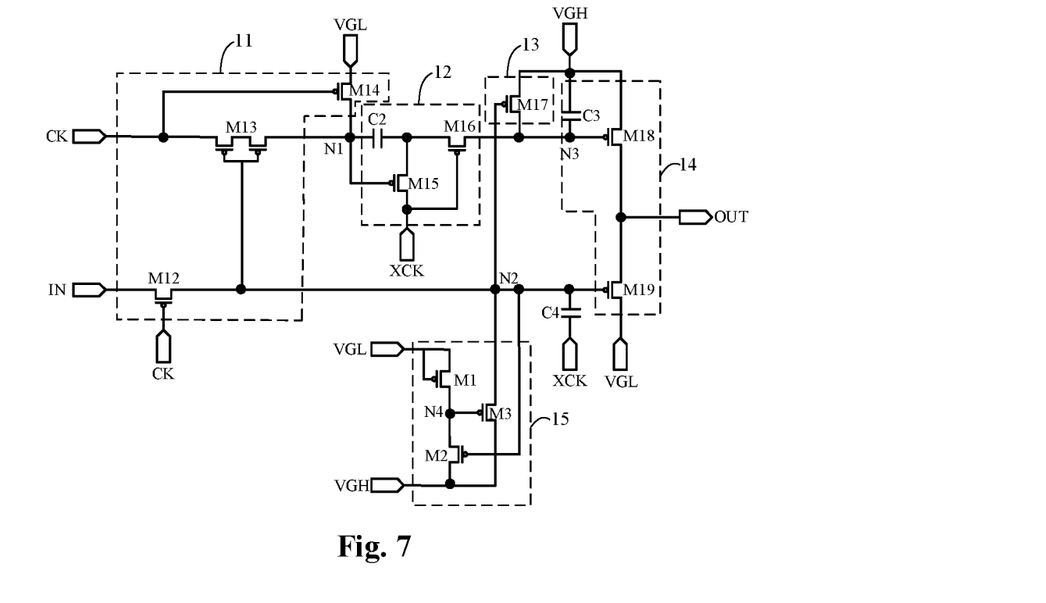
Figure 8:
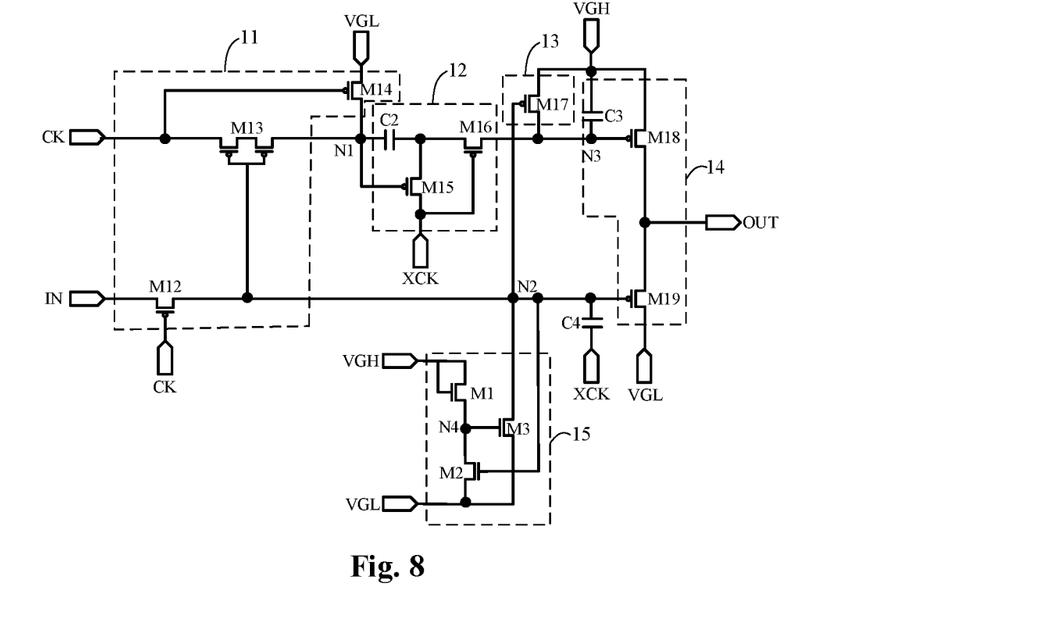
Figure 9:
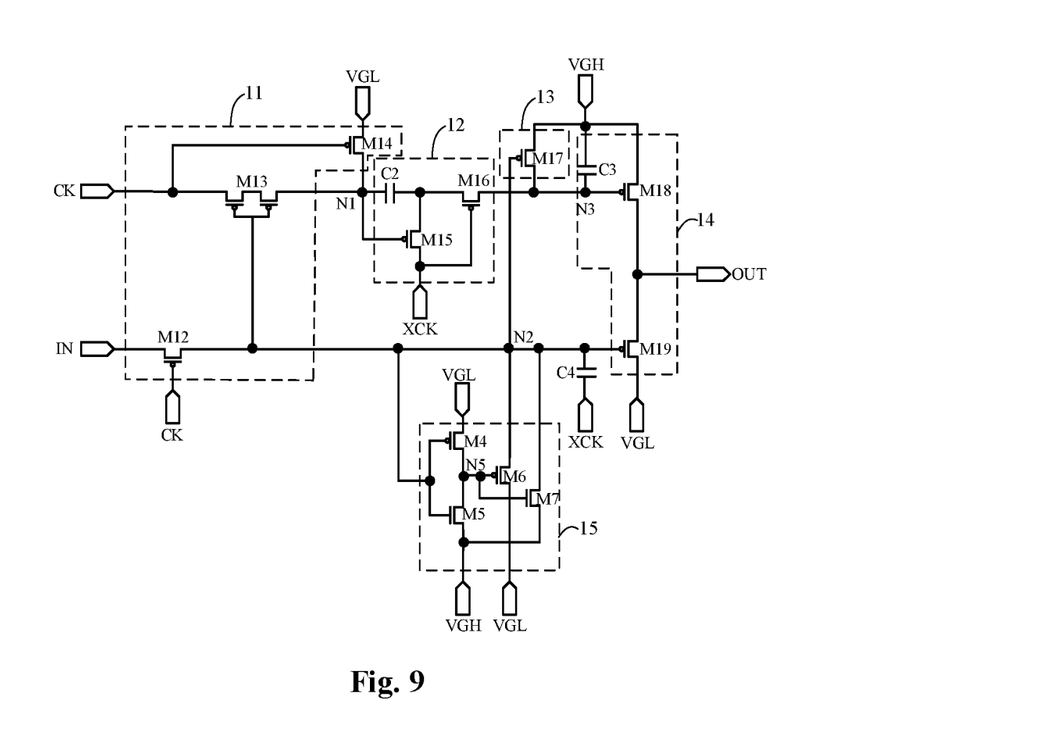

In some other optional implementations, as shown in any one of FIG. 7, FIG. 8, and FIG. 9, the input module 11 may include a twelfth transistor M12, a thirteenth transistor M13 and a fourteenth transistor M14.

A gate of the twelfth transistor M12 is connected to the first clock end CK, a first terminal of the twelfth transistor M12 is connected to the input end IN, and a second terminal of the twelfth transistor M12 is connected to the second node N2.

A gate of the thirteenth transistor M13 is connected to the second node N2, a first terminal of the thirteenth transistor M13 is connected to the first clock end CK, and a second terminal of the thirteenth transistor M13 is connected to the first node N1.

A gate of the fourteenth transistor M14 is connected to the first clock end CK, a first terminal of the fourteenth transistor M14 is connected to the first level end VGL, and a second terminal of the fourteenth transistor M14 is connected to the first node N1.

In an example, the twelfth transistor M12, the thirteenth transistor M13 and the fourteenth transistor M14 may all be P-type transistors.

For each of the twelfth transistor M12, the thirteenth transistor M13 and the fourteenth transistor M14, one the first terminal and the second terminal may be a source, and the other may be a drain.

According to an embodiment of the present application, the state of the thirteenth transistor M13 is controlled through the level of the second node N2, so that the control of the first node N1 can be realized with a small number of transistors.

In an example, the thirteenth transistor M13 may be a dual-gate transistor. In an example, when the thirteenth transistor M13 is the dual-gate transistor, the thirteenth transistor M13 may include two sub-transistors connected in series.

In some optional embodiments, as shown in any one of FIG. 4 to FIG. 9, the control module 12 may include a fifteenth transistor M15, a sixteenth transistor M16 and a second capacitor C2.

A gate of the fifteenth transistor M15 is connected to the first node N1, a first terminal of the fifteenth transistor M15 is connected to the second clock end XCK, and a second terminal of the fifteenth transistor M15 is connected to a first terminal of the sixteenth transistor M16.

A gate of the sixteenth transistor M16 is connected to the second clock end XCK, and a second terminal of the sixteenth transistor M16 is connected to the third node N3.

A first terminal of the second capacitor C2 is connected to the first node N1, and a second terminal of the second capacitor C2 is connected to the first terminal of the sixteenth transistor M16.

In an example, the fifteenth transistor M15 and the sixteenth transistor M16 may both be P-type transistors.

For each of the fifteenth transistor M15 and the sixteenth transistor M16, one of the first terminal and the second terminal may be a source, and the other may be a drain.

According to an embodiment of the present application, the second capacitor C2 has a storage function and can stabilize the level of the first node N1.

In some optional implementations, as shown in any one of FIG. 4 to FIG. 9, the pull-up module 13 may include a seventeenth transistor M17. A gate of the seventeenth transistor M17 is connected to the second node N2, a first terminal of the seventeenth transistor M17 is connected to the second level end VGH, and a second terminal of the seventeenth transistor M17 is connected to the third node N3.

The seventeenth transistor M17 may be a P-type transistor. For the seventeenth transistor M17, one of the first terminal and the second terminal may be a source, and the other may be a drain.

In some optional implementations, as shown in any one of FIG. 4 to FIG. 9, the output module 14 may include an eighteenth transistor M18, a nineteenth transistor M19 and a third capacitor C3.

A gate of the eighteenth transistor M18 is connected to the third node N3, a first terminal of the eighteenth transistor M18 is connected to the second level end VGH, and a second terminal of the eighteenth transistor M18 is connected to the output end OUT.

A gate of the nineteenth transistor M19 is connected to the second node N2, a first terminal of the nineteenth transistor M19 is connected to the first level end VGL, and a second terminal of the nineteenth transistor M19 is connected to the output end OUT.

A first terminal of the third capacitor C3 is connected to the second level end VGH, and a second terminal of the third capacitor C3 is connected to the third node N3.

The eighteenth transistor M18 and the nineteenth transistor M19 may be P-type transistors. For the eighteenth transistor M18 and the nineteenth transistor M19, one of the first terminal and the second terminal may be a source, and the other may be a drain.

In some optional implementations, as shown in any one of FIG. 4 to FIG. 9, a shift register circuit may further include a fourth capacitor C4. A first terminal of the fourth capacitor C4 is connected to the second clock end XCK, and a second terminal of the fourth capacitor C4 is connected to the second node N2.

Due to a bootstrapping effect of the fourth capacitor C4, when the signals of the second clock end XCK change from the high level to the low level, the level of the second node N2 changes to a lower low level, so that the nineteenth transistor M19 can be desirably maintained at the turn-on state.

With reference to FIG. 2 and FIG. 4, taking transistors of the input module 11, the control module 12, the pull-up module 13 and the output module 14 all being P-type transistors and being turned on when the input of the gate is a low-level, the process of driving the shift register may include the 6 phases described below.

It should be noted that, since the working process of the maintenance module 15 is only related to the level of the second node N2, and the working process of the maintenance module 15 has been described in the above examples, the maintenance module 15 will not be described again in the six phases as described below. In addition, the signal of the first level end VGL is always at the low level, and the signal of the second level end VGH is always at the high level.

It should also be noted that, at the end of the operation in a previous frame, the signal outputted from the output end of the shift register controls the sub-pixels in the display panel to emit light, so the signal output from the output end of the shift register may be at the low level.

In a first phase t1, the signal of the input end IN is at the high level, the signal of the first clock end CK is at the low level, and the signal of the second clock end XCK is at the high level. The eighth transistor M8 is turned on, the high level of the input end IN is transferred to the second node N2, the second node N2 is at the high level, and the nineteenth transistor M19 is turned off. The tenth transistor M10 and the eleventh transistor M11 are turned on, the low level of the first level end VGL is transferred to the first node N1, and the fifteenth transistor M15 is turned on. The high level of the input end IN is transferred to the sixth node N6, and the ninth transistor M9 is turned off. The sixteenth transistor M16 and the seventeenth transistor M17 are turned off. The third node N3 is maintained at the high level of the previous frame, and the output end OUT is maintained at the level of the previous frame, which is the low level.

In a second phase t2, the signal of the input end IN is at the high level, the signal of the first clock end CK is at the high level, and the signal of the second clock end XCK is at the low level. The eighth transistor M8 is turned off, the second node N2 is maintained at the high level, and the nineteenth transistor M19 is turned off. The tenth transistor M10 and the eleventh transistor M11 are turned off, the sixth node N6 is maintained at the high level, and the ninth transistor M9 is turned off. The first node N1 is maintained at the low level, the fifteenth transistor M15 is turned on, the low level of the second clock end XCK is transferred to the first terminal of the sixteenth transistor M16, the sixteenth transistor M16 is turned on, the low level of the first terminal of the sixteenth transistor M16 is transferred to the third node N3, the eighteenth transistor M18 is turned on, the high level of the second level end VGH is transferred to the output end OUT, and the output end OUT outputs the high level.

In a third phase t3, the signal of the input end IN is at the high level, the signal of the first clock end CK is at the low level, and the signal of the second clock end XCK is at the high level. The eighth transistor M8 is turned on, the high level of the input end IN is transferred to the second node N2, the second node N2 is at the high level, and the nineteenth transistor M19 is turned off. The tenth transistor M10 and the eleventh transistor M11 are turned on, the low level of the first level end VGL is transferred to the first node N1, and the fifteenth transistor M15 is turned on. The high level of the input end IN is transferred to the sixth node N6, and the ninth transistor M9 is turned off. The sixteenth transistor M16 and the seventeenth transistor M17 are turned off. The third node N3 is maintained at the low level of the previous phase, the eighteenth transistor M18 is turned on, the high level of the second level end VGH is transferred to the output end OUT, and the output end OUT continues outputting the high level.

In a fourth phase t4, the signal of the input end IN is at the low level, the signal of the first clock end CK is at the high level, and the signal of the second clock end XCK is at the low level. The eighth transistor M8 is turned off, the second node N2 is maintained at the high level, and the nineteenth transistor M19 is turned off. The tenth transistor M10 and the eleventh transistor M11 are turned off, the sixth node N6 is maintained at the high level, and the ninth transistor M9 is turned off. The first node N1 is maintained at the low level, the fifteenth transistor M15 is turned on, the low level of the second clock end XCK is transferred to the first terminal of the sixteenth transistor M16, the sixteenth transistor M16 is turned on, the low level of the first terminal of the sixteenth transistor M16 is transferred to the third node N3, the eighteenth transistor M18 is turned on, the high level of the second level end VGH is transferred to the output end OUT, and the output end OUT continues outputting the high level.

In a fifth phase t5, the signal of the input end IN is at the low level, the signal of the first clock end CK is at the low level, and the signal of the second clock end XCK is at the high level. The eighth transistor M8 is turned on, the low level of the input end IN is transferred to the second node N2, the second node N2 is at the low level, and the nineteenth transistor M19 is turned on. The low level of the first level end VGL is transferred to the output end OUT, and the output end OUT outputs the low level. The seventeenth transistor M17 is turned on, the high level of the second level end VGH is transferred to the third node N3, and the eighteenth transistor M18 is turned off. The tenth transistor M10 and the eleventh transistor M11 are turned on, the low level of the first level end VGL is transferred to the first node N1, the fifteenth transistor M15 is turned on, and the high level of the second clock end XCK is transferred to the second terminal of the second capacitor C2. The low level of the input end IN is transferred to the sixth node N6, the ninth transistor M9 is turned on, and the low level of the first clock end CK is also transferred to the first node N1. The sixteenth transistor M16 is turned off.

In a sixth phase t6, the signal of the input end IN is at the low level, the signal of the first clock end CK is at the high level, and the signal of the second clock end XCK is at the low level. The eighth transistor M8 is turned off, the second node N2 is maintained at the low level, and the nineteenth transistor M19 is turned on. The low level of the first level end VGL is transferred to the output end OUT, and the output end OUT continues outputting the low level. The seventeenth transistor M17 is turned on, the high level of the second level end VGH is transferred to the third node N3, and the eighteenth transistor M18 is turned off. The tenth transistor M10 and the eleventh transistor M11 are turned off, the sixth node N6 is maintained at the low level, the ninth transistor M9 is turned on, and the high level of the first clock end CK is also transferred to the first node N1. The fifteenth transistor M15 is turned off, the sixteenth transistor M16 is turned on, and the high level of the second terminal of the second capacitor C2 is also transferred to the third node N3.

The fifth phase t5 and the sixth phase t6 are subsequently repeated, and the output end of the shift register continues outputting the low level.

During the period in which the output end of the shift register continues outputting the low level, due to the bootstrapping effect of the fourth capacitor C4, when the signal of the second clock end CK2 changes from the high level to the low level, the level of the second node N2 changes to a lower low level, so that the nineteenth transistor M19 can be desirably maintained at the turn-on state.

Figure 10:
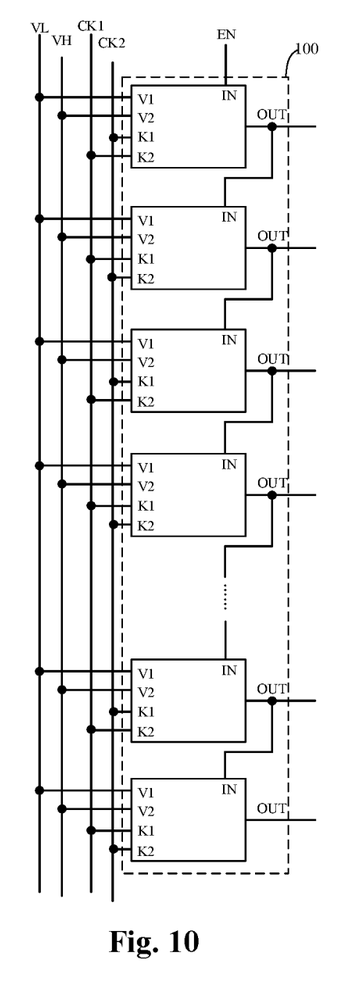
FIG. 10 illustrates a schematic structural diagram of a light-emission control circuit according to an embodiment of the present application.

Based on the same inventive concept, an embodiment of the present application further provides a light-emission control circuit. As shown in FIG. 10, the light-emission control circuit 100 may include a plurality of cascaded shift registers, and the shift registers may be the shift registers described in any of the foregoing implementations.

For example, it is exemplarily shown that the light-emission control circuit includes an n-stage shift register, the shift register may include an input end IN, a first clock signal end K1, a second clock signal end K2, a high-level input end V1, a low-level voltage end V2, and the signal output end OUT. The input end IN of a first stage shift register is connected to an initialization signal line EN, and the input end IN of the (i+1)-th (i is an integer greater than or equal to 1 and less than n) stage shift register is connected to the output end OUT of a previous stage shift register. The first clock signal end K1 of the j-th stage shift register is connected to a first clock signal line CK1, the second clock signal end K2 of the j-th stage shift register is connected to a second clock signal line CK2, the first clock signal end K1 of the (j+1)-th stage shift register is electrically connected to the second clock signal line CK2, and the second clock signal end K2 of the (j+1)-th stage shift register is electrically connected to the first clock signal line CK1. j is an odd or even number greater than or equal to 1 and less than or equal to n. It can be seen that, an initialization signal of a current-stage shift register is a light-emitting control signal outputted by the previous-stage shift register. After the previous-stage shift register outputs the light-emitting control signal, the operation of the current-stage shift register is initiated and then the current-stage shift register outputs a light-emitting control signal, so that the light-emission control circuit can output the light-emitting control signals stage by stage, and the output level of each stage of the shift register is ensured to be stable.

Figure 11:
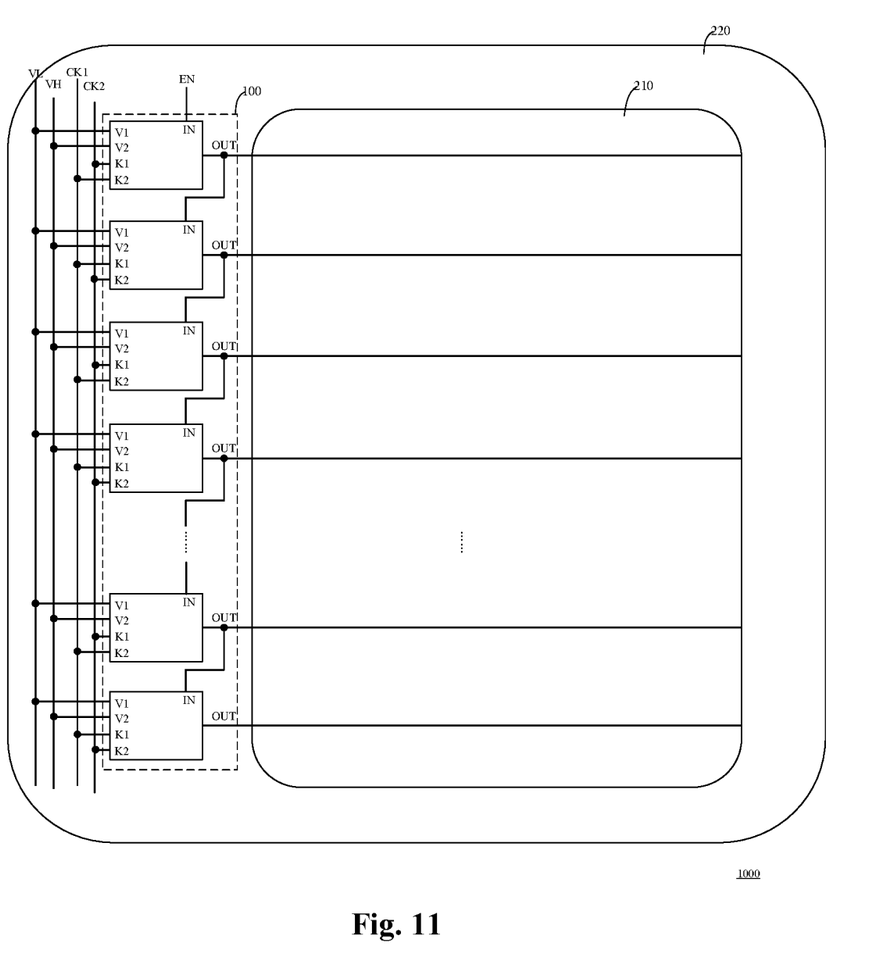
FIG. 11 illustrates a schematic structural diagram of a display panel according to an embodiment of the present application.

Based on the same inventive concept, an embodiment of the present application further provides a display panel. FIG. 11 is a schematic structural diagram of a display panel according to an embodiment of the present application. As shown in FIG. 11, a display panel 1000 includes the light-emission control circuit 100 according to any one of the embodiments of the present application.

Specifically, the display panel 1000 may include a display area 210 and a non-display area 220. The display area 210 includes sub-pixels (not shown in the figure). The light-emission control circuit 100 may be disposed in the non-display area 220. The light-emission control circuit 100 provides light-emitting control signals for the sub-pixels, so as to control the sub-pixels to emit light.

The embodiments of the present application as described above do not exhaustively describe all the details, nor do they limit the application to only the specific embodiments described. Obviously, many modifications and variations are possible in light of the above description. The detailed description of these embodiments are for a better explanation of principles and practical applications of the present application, to thereby enable those skilled in the art to best utilize the present application and various embodiments with various modifications. This application is to be limited only by the claims, along with their full scope and equivalents.

What is claimed is:

1. A shift register, comprising an input module, a control module, a pull-up module, an output module and a maintenance module, wherein the input module is connected to an input end, a first clock end, a first level end, a first node and a second node, and is configured to control levels of the first node and the second node in response to levels of the input end, the first clock end and the first level end;

the control module is connected to the first node, a third node and a second clock end, and is configured to control a level of the third node in response to the level of the first node and a level of the second clock end;

the pull-up module is connected to the second node, a second level end and the third node, and is configured to transfer a level of the second level end to the third node in response to an active level of the second node;

the output module is connected to the second node, the third node, the first level end and the second level end, and is configured to transfer a first level of the first level end to the output end in response to the active level of the second node, or transfer a second level of the second level end to the output end in response to an active level of the third node;

the maintenance module is connected to the second node, the first level end and the second level end, and is configured to respond to the level of the second node and maintain the level of the second node.

2. The shift register according to claim 1, wherein the maintenance module is specifically configured to:

transfer the second level of the second level end to the second node in response to a high level of the second node;

stop signal outputting in response to a low level of the second node to maintain the low level of the second node.

3. The shift register according to claim 2, wherein the maintenance module comprises a first transistor, a second transistor and a third transistor;

a first terminal of the first transistor is connected to a fourth node, and both a second terminal and a gate of the first transistor are connected to the first level end;

a first terminal of the second transistor is connected to the second level end, a second terminal of the second transistor is connected to the fourth node, and a gate of the second transistor is connected to the second node;

a first terminal of the third transistor is connected to the second level end, a second terminal of the third transistor is connected to the second node, and a gate of the third transistor is connected to the fourth node;

the first transistor, the second transistor and the third transistor are all P-type transistors.

4. The shift register according to claim 1, wherein the maintenance module is specifically configured to:

transfer a first voltage of the first level end to the second node in response to a low level of the second node;

stop signal outputting in response to a high level of the second node to maintain the high level of the second node.

5. The shift register according to claim 4, wherein the maintenance module comprises a first transistor, a second transistor and a third transistor;

a first terminal of the first transistor is connected to a fourth node, and both a second terminal and a gate of the first transistor are connected to the second level end;

a first terminal of the second transistor is connected to the first level end, a second terminal of the second transistor is connected to the fourth node, and a gate of the second transistor is connected to the second node;

a first terminal of the third transistor is connected to the first level end, a second terminal of the third transistor is connected to the second node, and a gate of the third transistor is connected to the fourth node;

the first transistor, the second transistor and the third transistor are all N-type transistors.

6. The shift register according to claim 3, wherein a ratio of a width to length ratio of a channel of the second transistor to a width to length ratio of a channel of the first transistor is a first ratio, an absolute value of a ratio of a voltage of a signal end connected to the first terminal of the first transistor to a voltage of a signal end connected to the first terminal of the second transistor is a second ratio;

the first ratio is greater than the second ratio.

7. The shift register according to claim 5, wherein a ratio of a width to length ratio of a channel of the second transistor to a width to length ratio of a channel of the first transistor is a first ratio, an absolute value of a ratio of a voltage of a signal end connected to the first terminal of the first transistor to a voltage of a signal end connected to the first terminal of the second transistor is a second ratio;

the first ratio is greater than the second ratio.

8. The shift register according to claim 1, wherein the maintenance module is specifically configured to:

transfer the second level of the second level end to the second node in response to a high level of the second node;

transfer the first level of the first level end to the second node in response to a low level of the second node.

9. The shift register according to claim 7, wherein the maintenance module comprises a fourth transistor, a fifth transistor, a sixth transistor and a seventh transistor;

a gate of the fourth transistor is connected to the second node, a first terminal of the fourth transistor is connected to a fifth node, and a second terminal of the fourth transistor is connected to the first level end;

a gate of the fifth transistor is connected to the second node, a first terminal of the fifth transistor is connected to the fifth node, and a second terminal of the fifth transistor is connected to the second level end;

a gate of the sixth transistor is connected to the fifth node, a first terminal of the sixth transistor is connected to the second node, and a second terminal of the sixth transistor is connected to the first level end;

a gate of the seventh transistor is connected to the fifth node, a first terminal of the seventh transistor is connected to the second node, and a second terminal of the seventh transistor is connected to the second level end;

the fourth transistor and the sixth transistor are P-type transistors, and the fifth transistor and the seventh transistor are N-type transistors.

10. The shift register according to claim 1, wherein the input module comprises an eighth transistor, a ninth transistor, a tenth transistor, an eleventh transistor and a first capacitor;

a gate of the eighth transistor is connected to the first clock end, a first terminal of the eighth transistor is connected to the input end, and a second terminal of the eighth transistor is connected to the second node;

a gate of the ninth transistor is connected to a sixth node, a first terminal of the ninth transistor is connected to the first clock end, and a second terminal of the ninth transistor is connected to the first node;

a gate of the tenth transistor is connected to the first clock end, a first terminal of the tenth transistor is connected to the first level end, and a second terminal of the tenth transistor is connected to the first node;

a gate of the eleventh transistor is connected to the first clock end, a first terminal of the eleventh transistor is connected to the input end, and a second terminal of the eleventh transistor is connected to the sixth node;

a first terminal of the first capacitor is connected to the sixth node, and a second terminal of the first capacitor is connected to the second level end.

11. The shift register according to claim 10, wherein the ninth transistor is a dual-gate transistor.

12. The shift register according to claim 1, wherein the input module comprises a twelfth transistor, a thirteenth transistor and a fourteenth transistor;

a gate of the twelfth transistor is connected to the first clock end, a first terminal of the twelfth transistor is connected to the input end, and a second terminal of the twelfth transistor is connected to the second node;

a gate of the thirteenth transistor is connected to the second node, a first terminal of the thirteenth transistor is connected to the first clock end, and a second terminal of the thirteenth transistor is connected to the first node;

a gate of the fourteenth transistor is connected to the first clock end, a first terminal of the fourteenth transistor is connected to the first level end, and a second terminal of the fourteenth transistor is connected to the first node.

13. The shift register according to claim 1, wherein the control module comprises a fifteenth transistor, a sixteenth transistor and a second capacitor;

a gate of the fifteenth transistor is connected to the first node, a first terminal of the fifteenth transistor is connected to the second clock end, and a second terminal of the fifteenth transistor is connected to a first terminal of the sixteenth transistor;

a gate of the sixteenth transistor is connected to the second clock end, and a second terminal of the sixteenth transistor is connected to the third node;

a first terminal of the second capacitor is connected to the first node, and a second terminal of the second capacitor is connected to the first terminal of the sixteenth transistor.

14. The shift register according to claim 1, wherein the pull-up module comprises a seventeenth transistor, a gate of the seventeenth transistor is connected to the second node, a first terminal of the seventeenth transistor is connected to the second level end, and a second terminal of the seventeenth transistor is connected to the third node.

15. The shift register according to claim 1, wherein the output module comprises an eighteenth transistor, a nineteenth transistor and a third capacitor;

a gate of the eighteenth transistor is connected to the third node, a first terminal of the eighteenth transistor is connected to the second level end, and a second terminal of the eighteenth transistor is connected to the output end;

a gate of the nineteenth transistor is connected to the second node, a first terminal of the nineteenth transistor is connected to the first level end, and a second terminal of the nineteenth transistor is connected to the output end;

a first terminal of the third capacitor is connected to the second level end, and a second terminal of the third capacitor is connected to the third node.

16. The shift register according to claim 1, wherein the shift register further comprises a fourth capacitor, a first terminal of the fourth capacitor is connected to the second clock end, and a second terminal of the fourth capacitor is connected to the second node.

17. A method for driving a shift register comprising an input module, a control module, a pull-up module, an output module and a maintenance module, wherein the input module is connected to an input end, a first clock end, a first level end, a first node and a second node, and is configured to control levels of the first node and the second node in response to levels of the input end, the first clock end and the first level end;

the control module is connected to the first node, a third node and a second clock end, and is configured to control a level of the third node in response to the level of the first node and a level of the second clock end;

the pull-up module is connected to the second node, a second level end and the third node, and is configured to transfer a level of the second level end to the third node in response to an active level of the second node;

the output module is connected to the second node, the third node, the first level end and the second level end, and is configured to transfer a first level of the first level end to the output end in response to the active level of the second node, or transfer a second level of the second level end to the output end in response to an active level of the third node;

the maintenance module is connected to the second node, the first level end and the second level end, and is configured to respond to the level of the second node and maintain the level of the second node, and wherein the method comprises:

in a first phase, providing a high level by the input end, providing a low level by the first clock end, and providing a high level by the second clock end, so that the high level of the input end is transferred to the second node, a low level of the first level end is transferred to the first node, the third node is maintained at a low level, and a low level is outputted by the output end;

in a second phase, providing the high level by the input end, providing a high level by the first clock end, and providing a low level by the second clock end, so that the second node is maintained at a high level, the first node is maintained at a low level, the low level of the second clock end is transferred to the third node, and a high level is outputted by the output end;

in a third phase, providing the high level by the input end, providing the low level by the first clock end, and providing the high level by the second clock end, so that the high level of the input end is transferred to the second node, the low level of the first clock end and the low level of the first level end are transferred to the first node, the third node is maintained at the low level, and the high level is outputted by the output end;

in a fourth phase, providing a low level by the input end, providing the high level by the first clock end, and providing the low level by the second clock end, so that the second node is maintained at the high level, the first node is maintained at the low level, the low level of the second clock end is transferred to the third node, and the high level is outputted by the output end;

in a fifth phase, providing the low level by the input end, providing the low level by the first clock end, and providing the high level by the second clock end, so that the low level of the input end is transferred to the second node, the low level of the first clock end and the low level of the first level end are transferred to the first node, the high level of the second level end is transferred to the third node, and the low level is outputted by the output end;

in a sixth phase, providing the low level by the input end, providing the high level by the first clock end, and providing the low level by the second clock end, so that the second node is maintained at the low level, the high level of the first clock end is transferred to the first node, the high level of the second level end is transferred to the third node, and the low level is outputted by the output end.

18. A light-emission control circuit, comprising:
a plurality of cascaded shift registers, the shift register being the shift register according to claim 1.

19. A display panel, comprising the light-emission control circuit according to claim 18.

* * * * *